United States Patent

[11] 3,577,099

[72] Inventors James A. Hall;
Harry J. Peppiatt, Lynchburg, Va.
[21] Appl. No. 802,771
[22] Filed Feb. 27, 1969
[45] Patented May 4, 1971
[73] Assignee General Electric Company

[54] MICROWAVE OSCILLATOR HAVING DIRECTIONAL COUPLER IN FEEDBACK PATH
7 Claims, 5 Drawing Figs.

[52] U.S. Cl. .......... 331/96, 331/108, 331/135, 331/116, 331/117, 331/172, 333/10
[51] Int. Cl. .......... H03b 5/12, H03b 5/18
[50] Field of Search .......... 331/82, 96, 99—102, 108.4, 116, 117 (D), 135, 136, 172; 333/10

[56] References Cited

UNITED STATES PATENTS

| | | | |
|---|---|---|---|
| 3,104,359 | 9/1963 | Tachizawa et al. | 331/82 |
| 3,178,655 | 4/1965 | Ries et al. | 331/82X |
| 3,345,582 | 10/1967 | Maupin | 331/108(.4) |
| 3,381,244 | 4/1968 | Dalley | 333/10 |

FOREIGN PATENTS

| | | | |
|---|---|---|---|
| 884,841 | 12/1961 | Great Britain | 331/82 |

*Primary Examiner*—John Kominski
*Assistant Examiner*—Siegfried H. Grimm
*Attorneys*—James J. Williams, Frank L. Neuhauser and Oscar B. Waddell

ABSTRACT: A microwave oscillator is provided with a solid-state amplifier device whose output is coupled to the input by a directional coupler. The oscillator characteristics can be reliably calculated, and the oscillator signals have a relatively small amount of noise.

INVENTORS:
JAMES A. HALL,
HARRY J. PEPPIATT,

BY James J. Williams
THEIR ATTORNEY.

INVENTORS:
JAMES A. HALL,
HARRY J. PEPPIATT,

BY James J. Williams
THEIR ATTORNEY.

MICROWAVE OSCILLATOR HAVING DIRECTIONAL COUPLER IN FEEDBACK PATH

BACKGROUND OF THE INVENTION

Our invention relates to a microwave oscillator, and particularly to a microwave oscillator using a solid-state amplifier and a directional coupler.

The design of relatively low-noise, high-power microwave transistor oscillators apparently presents many difficult, if not impossible, problems. As a result, the relevant literature reveals very little help or guidance. Because of this situation, such microwave oscillators are designed by a cut-and-try procedure. While such a procedure may eventually result in a suitable oscillator, the procedure may eventually result in a suitable oscillator, the procedure requires considerable time and money.

Accordingly, an object of our invention is to provide a new and improved oscillator whose design and prediction of operation are relatively accurate.

Another object of our invention is to provide an improved oscillator which is relatively stable, which can be operated in the microwave frequencies, and whose performance can be calculated relatively accurately.

SUMMARY OF THE INVENTION

Briefly, these and other objects are achieved in accordance with our invention by an amplifier device, preferably of the solid-state or transistor type. The output electrodes of the amplifier device are coupled to the input electrodes of the amplifier device through a directional coupler and a suitable phase shift circuit, so that oscillations are produced. When operating as an oscillator, the amplifier device has the same loading conditions as an amplifier device. Hence, the operating parameters can be calculated and predicted relatively accurately. Further, the oscillator has relatively low noise levels.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

DESCRIPTION OF THE PREFERRED EMBODIMENTS

Figure 1:
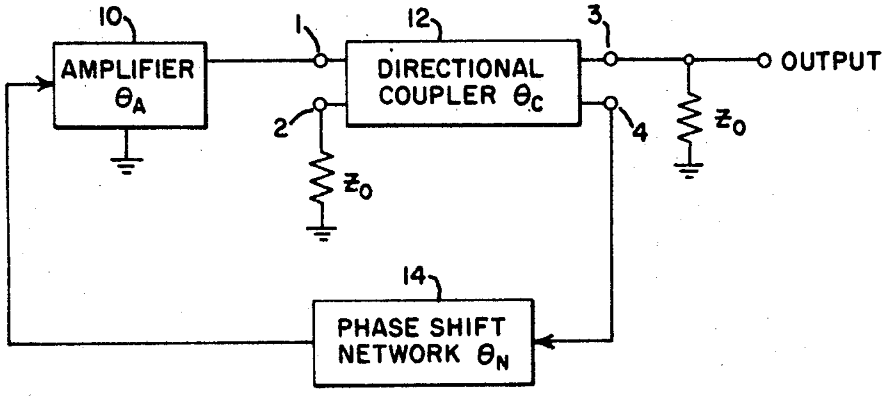
FIG. 1 shows a block diagram of an improved oscillator in accordance with our invention.

With reference to FIG. 1, we have shown a block diagram of an improved oscillator in accordance with our invention. The oscillator comprises an amplifier 10 having suitable gain, a directional coupler 12, and a phase shift network 14. The amplifier 10 may be a class C, high-power amplifier of known configuration. The directional coupler 12 is a known device, having four terminals 1, 2, 3, 4, and having a coupling $C_0$ numerically slightly less than the gain of the amplifier 10. A suitable load impedance $Z_0$ is coupled to the terminal 2, whose output signal level in response to a signal at the terminal 1 is substantially zero. The output from the oscillator is derived at the terminal 3, which should also be provided with the same load impedance $Z_0$. Signals at the terminal 4 are fed back to the amplifier 10 through the phase shift network 14 to provide regenerative signals and, hence, oscillation. As will be appreciated by persons skilled in the art, the amplifier phase shift $\theta_A$ plus the coupler phase shift $\theta_C$ plus the phase shift network phase shift $\theta_N$ should be equal to an integral multiple of 360°, so that oscillations will be produced.

Figure 2:
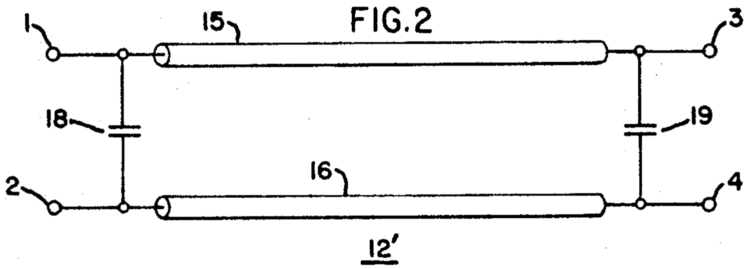
FIG. 2 shows an electrical diagram of a directional coupler which may be used in the oscillator of FIG. 1.

FIG. 2 shows one embodiment of a directional coupler 12' which can be used for the directional coupler 12 in FIG. 1. The coupler 12' shown in FIG. 2 comprises two coaxial transmission lines, 15,16, preferably having the same length and characteristic impedance. The ends of the inner conductor of the transmission line 15 are respectively connected to the terminals 1,3, and the ends of the inner conductor of the transmission line 16 are respectively connected to the terminals 2,4. Suitable coupling is provided by means of two preferably similar capacitors 18,19, respectively coupled between terminals 1 and 2, and terminals 3 and 4. This coupler 12' can be designed on the basis of the following equations:

$$\tan \theta = \frac{1}{\omega C Z_0}$$

$$C_0 = \frac{1}{\operatorname{Cos} \theta}$$

In these equations, $\Theta$ is the electrical length of the transmission lines 15,16, $C_0$ is the coupling between the terminals 1 and 4, $\omega$ is $2\pi$ times the desired center frequency, C is the capacity of each of the capacitors 18,19, and $Z_0$ is the characteristic impedance of the transmission lines 15,16.

Persons skilled in the art will appreciate that an oscillator having a directional coupler, such as described in connection with FIGS. 1 and 2, can be relatively easily and accurately designed, since the oscillator operation conforms to that of an amplifier, whose design is relatively easy and reliable. The design techniques for a stable, class C, high-power, high frequency transistor amplifier have progressed to the point where excellent results in terms of stable, predictable performance can be achieved. In the design of an oscillator in accordance with our invention, a power amplifier with suitable source and load impedances is first designed using known techniques. Then, a matched directional coupler, such as the coupler 12 of FIG. 2, is designed in accordance with the equations given above. The coupler is connected to the amplifier, such as the amplifier 10 shown in FIG. 1, with a suitable phase shift network. Thus, we provide an oscillator that is relatively simple and fundamental in its concepts, but that is accurately and reliably predictable in its operation and performance. This is because we utilize a conventional power amplifier design with a directional coupler that provides oscillation, but that does not change the predictability and reliability of the power amplifier operation.

Figure 3:
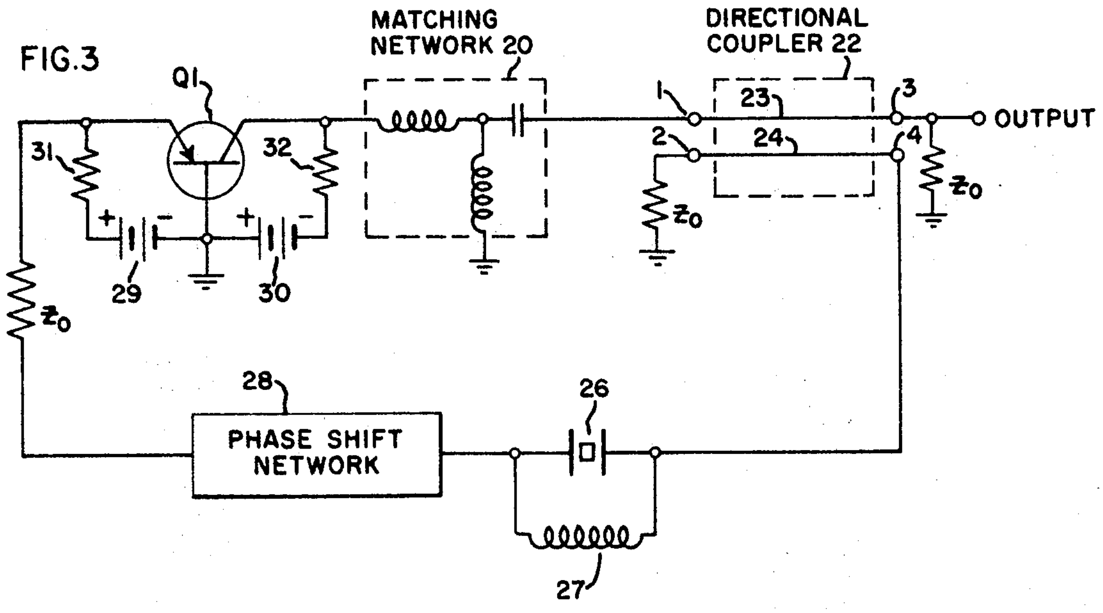
FIG. 3 shows an electrical circuit diagram of one embodiment of an oscillator in accordance with our invention.

FIG. 3 shows an electrical circuit diagram of one embodiment of an oscillator constructed in accordance with our invention. In FIG. 3, amplification for the oscillator is provided by an electron current control device, such as a PNP-type transistor Q1 connected in a common base circuit. The collector of the transistor Q1 is coupled through an impedance-matching network 20 comprising a series inductor, a series capacitor, and a shunt inductor. The output from the matching network 20 is coupled to the terminal 1 of a directional coupler 22. The directional coupler 22 utilizes two transmission lines 23,24, which are coupled to each other by being positioned in parallel relation for a suitable length. Such a construction makes the coupler 22 particularly useful in a stripline type of circuit. The terminal 3 of the coupler 22 provides the oscillator output, and is provided with a suitable load impedance $Z_0$. The terminal 2 is also provided with a suitable load impedance $Z_0$. The terminal 4 is connected to a resonant circuit comprising a piezoelectric crystal 26 shunted by an inductor 27 which tunes out the crystal parallel capacity. This resonant circuit is coupled through a phase shift network 28, which in turn is coupled through an impedance-matching resistor $Z_0$ to the emitter of the transistor Q1. Suitable operating voltages are provided for the oscillator by sources of direct current 29,30, respectively connected through resistors 31,32. The oscillator of FIG. 3 is relatively simple in construction, but can be reliably and accurately designed. Further, the oscillator of FIG. 3 lends itself to printed circuit or stripline types of arrangements, since the transmission lines 23,24 do not require external capacitors.

Figure 4:
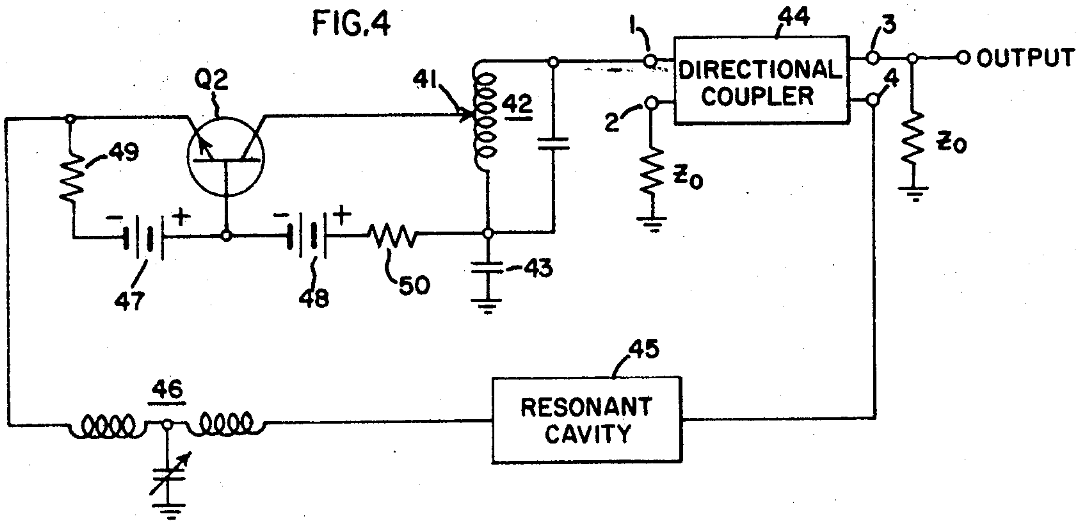
FIG. 4 shows an electrical circuit diagram of another embodiment of an oscillator in accordance with our invention.

FIG. 4 shows an electrical circuit diagram of another oscillator constructed in accordance with our invention. The oscillator of FIG. 4 utilizes an NPN-type transistor Q2, whose collector is connected to a movable tap 41 which engages an inductor of a parallel resonant circuit 42. Radio frequency ground for the resonant circuit 42 is provided by a capacitor 43. The output of the resonant circuit 42 is coupled to the terminal 1 of a directional coupler 44, which may be of the type shown in FIG. 3, or the coaxial transmission lines shown in FIG. 2. The terminal 3 is connected to the output having a characteristic impedance $Z_o$. The terminal 4 is coupled through a resonant circuit 45, which may be a cavity or other suitable arrangement. The resonant circuit 45 is coupled to an impedance matching network 46 comprising two series inductors and a shunt capacitor. The network 46 is coupled to the emitter of the transistor Q2. Suitable operating voltages are provided for the oscillator by sources of direct current 47,48, respectively connected through resistors 49,50. As described in connection with the previous circuits, the oscillators of FIG. 4 can be easily and accurately designed, and is suitable for operation in the microwave frequency ranges.

The oscillator of FIG. 4 was built and constructed to operate at a fundamental frequency of 280 Megahertz (mHz.). The output of the oscillator was derived from the terminal 3 of the coupler 44, and was a frequency-multiplied by a factor of 24. The oscillator was designed to receive a direct current power of 5.52 watts, and calculations indicated that the oscillator would produce a radio frequency power output of 2.85 watts, at an efficiency of 52 percent. When the oscillator was operated, it was found that it had an efficiency of 51.6 percent, a value which is very close to the calculated value, and much closer than calculated values for previously designed oscillators. In addition to the oscillator design's being relatively accurate, the oscillator had a relatively low FM (frequency modulation) noise level.

Figure 5:
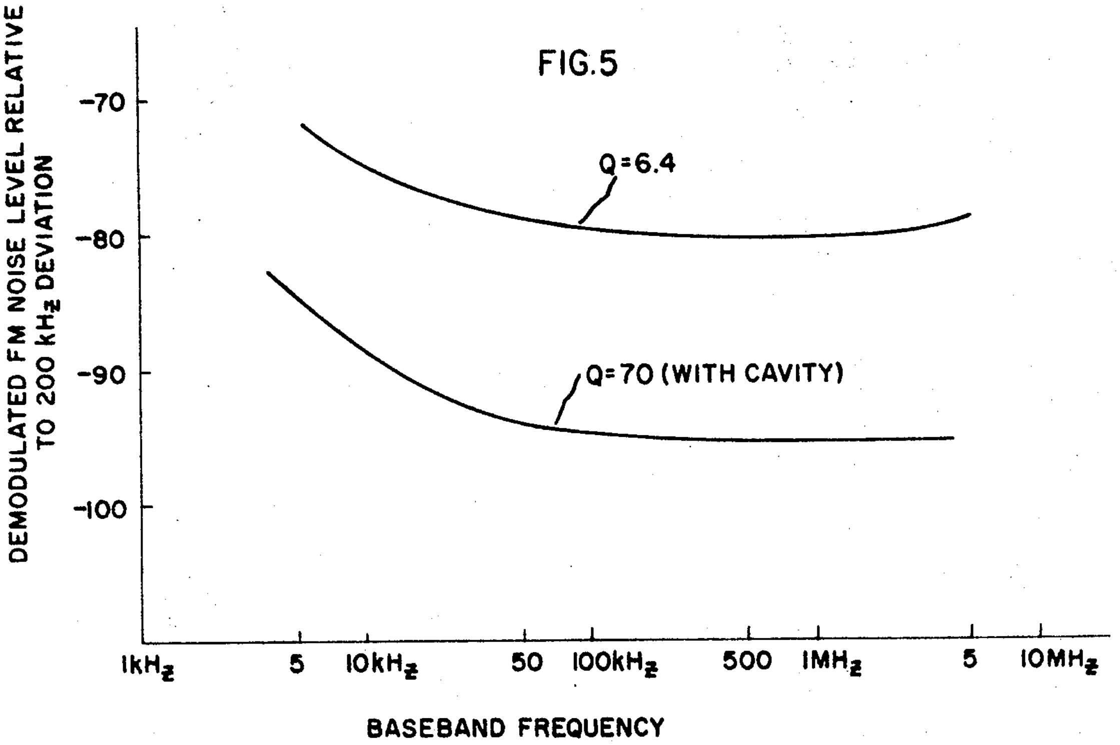
FIG. 5 shows curves illustrating the operation of the oscillator of FIG. 4.

FIG. 5 shows the demodulated FM noise level relative to a reference FM deviation of 200 kilohertz (kHz.) for baseband frequencies between approximately 5 kilohertz (kHz.) and 5 Megahertz (MHz.). Without the resonant cavity 45, and with a circuit Q of 6.4, the noise level was between 72 and 80 db. below the reference level. With the cavity 45 connected to provide a circuit Q of 70, the noise level was between 85 and 95 db. below the reference level. Thus, our oscillator has good operation in terms of low FM noise level.

It will thus be seen that our oscillator circuit can be accurately calculated. Further, our oscillator has relatively low FM noise levels, and is relatively quite efficient. While our invention has been described with reference to selected embodiments, persons skilled in the art will appreciate that modifications may be made. For example, various types of directional couplers may be used in combination with various types of resonant circuits. The phase-shift networks may be lumped circuits, or may be selected lengths of transmission lines, depending upon the preference for particular applications. If desired, our oscillator can be phase-locked with a locking signal from an external source having an impedance $Z_o$. This locking signal can be inserted at the terminal 2 of the directional couplers shown and described without altering the oscillator impedance levels. If the external source of the locking signal is crystal controlled, and if the level of the locking signal is properly adjusted, our oscillator will have the long term stability and low noise at the lower FM sideband frequencies typical of the crystal oscillator, and the excellent low FM noise at the higher sideband frequencies typical of a high-power, high frequency, free-running oscillator. The use of such a locking signal provides a convenient means for measuring the dynamic loaded bandwidth of the oscillator which, along with noise measurements, enables the equivalent noise temperature of the oscillator to be estimated. With this estimation, the flat thermal noise contribution of the oscillator can then be calculated on the basis of the bandwidth of the oscillator. Therefore, while our invention has been described with reference to particular embodiments, it is to be understood that modifications may be made without departing from the spirit of the invention or from the scope of the claims.

What we claim as new and desire to secure by Letters Patent of the United States is:

We claim:

1. An improved oscillator circuit comprising:
a. an electron current control device having an input and an output;
b. a directional coupler having a main input terminal, a second input terminal, a main output terminal, and a second output terminal;
c. means coupling said main input terminal to said control device output;
d. means coupled to said second input terminal for supplying a locking signal thereto;
e. means coupling said second output terminal to said control device input;
f. and means coupled to said main output terminal for deriving a signal therefrom.

2. The improved oscillator circuit of claim 1 wherein said main output terminal is coupled to said input terminal by a selected amount, and wherein said second input terminal is coupled to said main input terminal by an amount less than said selected amount.

3. The improved oscillator circuit of claim 1 wherein a frequency-selective element is inserted in said means coupling said second output terminal to said control device input.

4. An improved oscillator circuit for producing electrical signals comprising:
a. an electron current-amplifying device having input electrodes and output electrodes;
b. a first transmission line having an input terminal and an output terminal;
c. a second transmission line having an input terminal and an output terminal;
d. said first and second transmission lines being coupled together with a selected impedance to form a directional coupler;
e. means coupling said first transmission line input terminal to said output electrodes of said electron current-amplifying device;
f. means coupling said second transmission line output terminal to said input electrodes of said electron current-amplifying device;
g. an output impedance coupled to said first transmission line output terminal;
h. and means coupled to said second transmission line input terminal for supplying a locking signal thereto.

5. The improved oscillator circuit of claim 4 wherein a frequency-selective element is inserted in said means coupling said second transmission line output terminal to said input electrodes of said electron current-amplifying device.

6. The improved oscillator circuit of claim 5 where said first and second transmission lines are coupled together with distributed capacity.

7. The improved oscillator circuit of claim 5 wherein said first and second transmission lines are coupled together with lumped capacitors.